United States Patent
Mallikarjunaswamy

(10) Patent No.: US 8,937,356 B2
(45) Date of Patent: *Jan. 20, 2015

(54) ELECTROSTATIC DISCHARGE (ESD) PROTECTION APPLYING HIGH VOLTAGE LIGHTLY DOPED DRAIN (LDD) CMOS TECHNOLOGIES

(75) Inventor: Shekar Mallikarjunaswamy, San Jose, CA (US)

(73) Assignee: Alpha Omega Semiconductor Inc., Sunnyvale, CA (US)

( * ) Notice: Subject to any disclaimer, the term of this patent is extended or adjusted under 35 U.S.C. 154(b) by 905 days.

This patent is subject to a terminal disclaimer.

(21) Appl. No.: 13/066,017

(22) Filed: Apr. 5, 2011

(65) Prior Publication Data

US 2011/0180845 A1   Jul. 28, 2011

Related U.S. Application Data

(63) Continuation of application No. 12/152,805, filed on May 16, 2008, now Pat. No. 7,919,817.

(51) Int. Cl.
*H01L 23/62* (2006.01)
*H01L 27/02* (2006.01)

(52) U.S. Cl.
CPC .................... *H01L 27/0251* (2013.01)

USPC .................................. 257/355; 257/E29.015

(58) Field of Classification Search
CPC ............ H01L 27/0266; H01L 27/0255; H01L 27/0262; H01L 27/0259
USPC .................. 257/107, 186, 199, 355, E29.015; 438/91, 133

See application file for complete search history.

(56) References Cited

U.S. PATENT DOCUMENTS

| 6,365,932 | B1 * | 4/2002 | Kouno et al. ................. 257/341 |
| 6,788,507 | B2 * | 9/2004 | Chen et al. ....................... 361/56 |
| 7,919,817 | B2 * | 4/2011 | Mallikarjunaswamy ..... 257/355 |
| 8,093,145 | B2 * | 1/2012 | Morris .......................... 438/527 |

* cited by examiner

*Primary Examiner* — Quoc Hoang
(74) *Attorney, Agent, or Firm* — Bo-In Lin

(57) ABSTRACT

An electrostatic discharge (ESD) protection circuit includes a triggering diode that includes a junction between a P-grade (PG) region and an N-well. The PG region has a dopant profile equivalent to a P-drain dopant profile of a PMOS transistor having a breakdown voltage represented by V whereby the triggering diode for conducting a current when a voltage greater than the breakdown voltage V is applied. In an exemplary embodiment, the dopant profile of the PG region includes two dopant implant profiles that include a shallow implant profile with a higher dopant concentration and a deep implant profile with a lower dopant concentration.

16 Claims, 6 Drawing Sheets

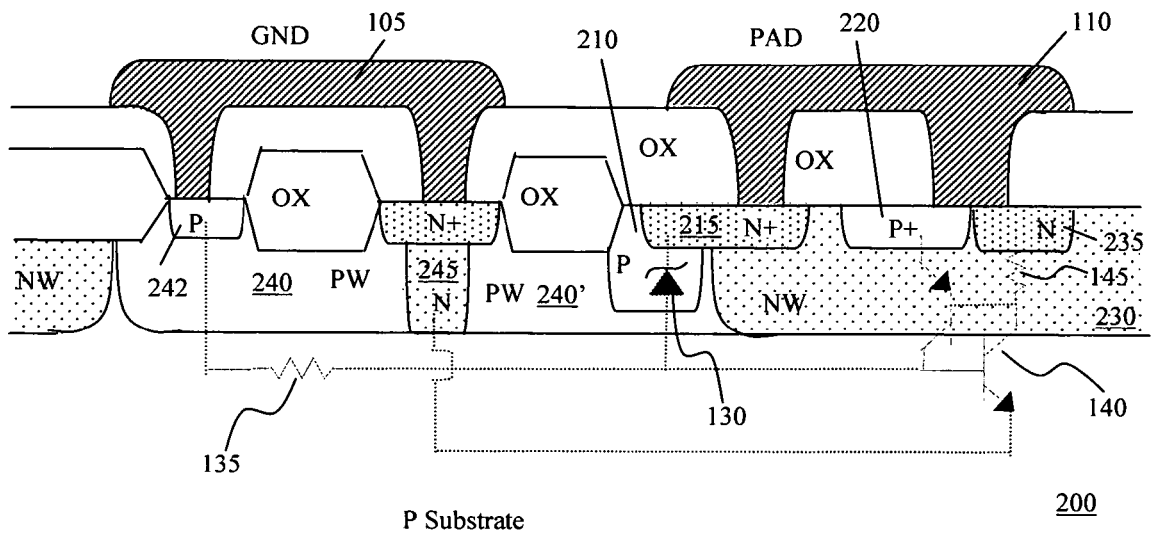
Fig. 1A (Reference Art)
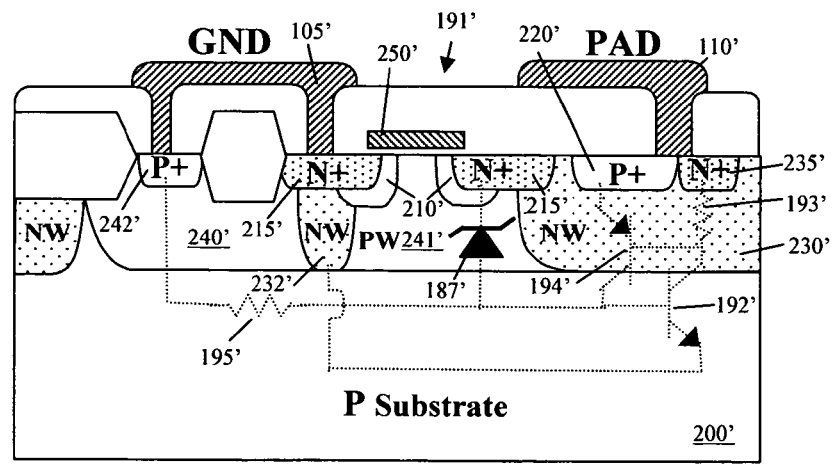
Fig. 1B (Reference Art)

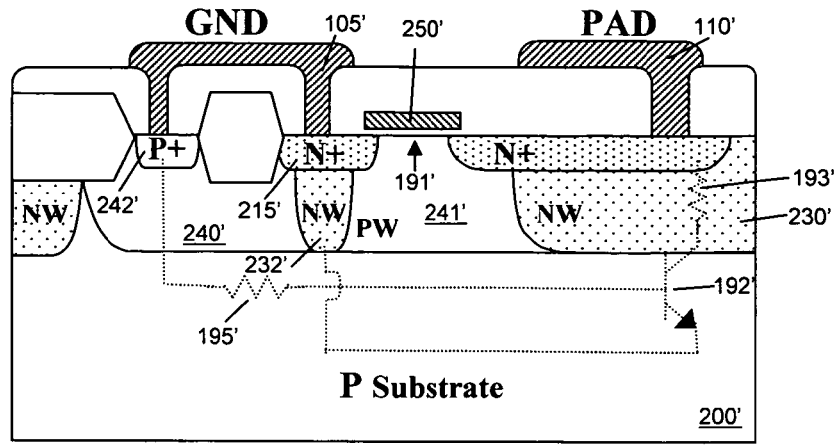
Fig. 1C (Reference Art)
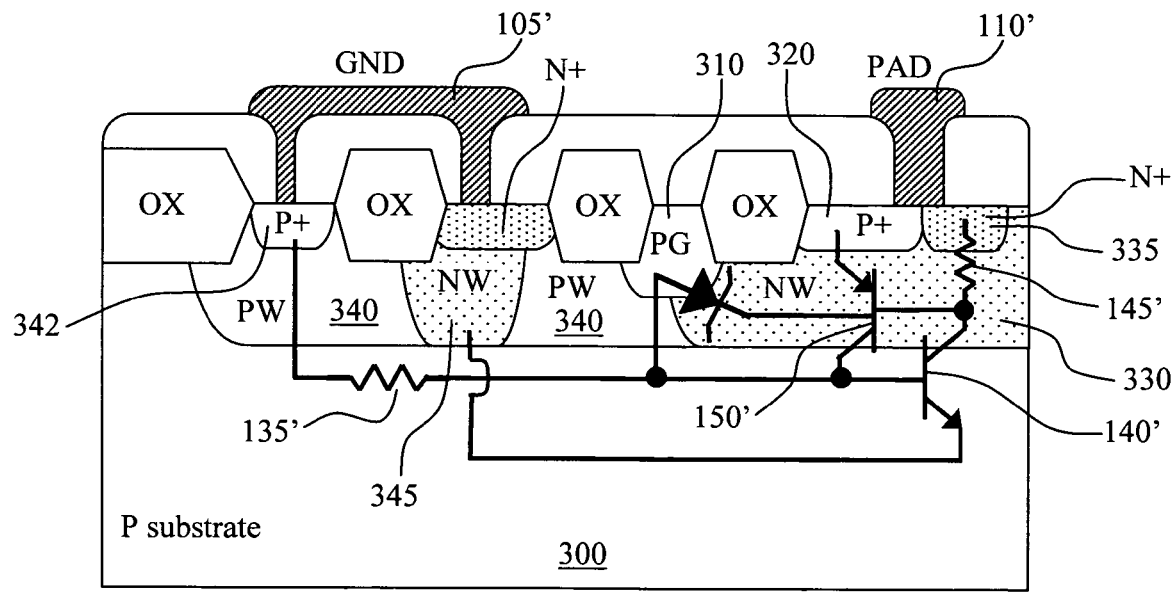
Fig. 2

ELECTROSTATIC DISCHARGE (ESD) PROTECTION APPLYING HIGH VOLTAGE LIGHTLY DOPED DRAIN (LDD) CMOS TECHNOLOGIES

This patent application is a Continuation application and claims the Priority Date of a co-pending application Ser. No. 12/152,805 filed on May 16, 2008 by common Inventors of this Application. The Disclosures made in the patent application Ser. No. 12/152,805 are hereby incorporated by reference.

BACKGROUND OF THE INVENTION

1. Field of the Invention

The invention relates generally to a circuit configuration and method of manufacture of an electronic device protected by an electrostatic discharge (ESD) protection circuit. More particularly, this invention relates to an improved circuit configuration and method of manufacture of a electronic device protected by an ESD protection circuit having a compact device configuration for operating at a high voltage while manufactured with simplified processing steps without requiring additional masks.

2. Description of the Relevant Art

Current technologies for designing and manufacturing the electronic devices with electrostatic discharge (ESD) protection circuits, especially for electronic devices operated at high voltages, e.g., up to 18 volts or higher, are still confronted with technical difficulties and limitations. The manufacturing technologies and device configurations implemented for these types of high voltage ESD protection circuits generally required additional number of masks. Furthermore, the high voltage ESD protection circuits occupy larger areas. For these reasons, high voltage ESD protection circuits become expensive to implement.

Therefore, a need still exists in the fields of circuit design and device manufactures for providing a new and improved circuit configuration and manufacturing method to resolve the above-discussed difficulties. Specifically, a need still exists to provide new and improved ESD protection circuits that can perform good voltage clamping function at higher voltage ranges, occupying smaller areas and providing high voltage ESD functions while being manufacturable by applying lightly doped drain (LDD) complementary metal oxide semiconductor (CMOS) technologies.

SUMMARY OF THE PRESENT INVENTION

It is therefore an aspect of the present invention to provide an improved ESD protection circuit to have an improved performance with compact device configuration that can be manufactured without additional masks such that effective high voltage ESD protection can be provided at reduced cost.

Another aspect of this invention is to provide ESD protection circuit on P-substrate without additional masks by applying 18V CMOS processes wherein a high breakdown voltage for a P-channel MOS (PMOS) device up to approximately 22 volts and for a N-channel MOS (NMOS) device up to approximately 25 volts can be achievable.

Another aspect of this invention is to provide ESD protection circuit with improved circuit configurations with P-grade (PG) drifted high voltage PMOS or N-grade (NG) drifted high voltage NMOS and implementing PMOS breakdown voltage (BV) triggered silicon controlled rectifier (SCR) to achieve improved protection at higher breakdown voltages.

Briefly in a preferred embodiment this invention discloses an electronic device protected by an electrostatic discharge (ESD) protection circuit. The ESD protection circuit includes a triggering diode including a junction between a PG region and a N-well (NW) wherein the PG region having a dopant profile equivalent to a P-drain dopant profile of a PMOS transistor having a breakdown voltage represented by V whereby the triggering diode for conducting a current when a voltage greater than the breakdown voltage V is applied. In an exemplary embodiment, the dopant profile of the PG region further comprising two dopant implant profiles including a shallow implant profile with a higher dopant concentration and a deep implant profile with a lower dopant concentration. In another exemplary embodiment, the dopant profile of the PG region further comprising two dopant implant profiles including a shallow implant profile with a higher dopant concentration of approximately 5E19 ions/cm$^3$ to a depth less than 0.5 micrometers and a deep implant profile with a lower dopant concentration of approximately 1E18 ions/cm$^3$ to a depth of about than 1.0 micrometer to provide a breakdown voltage in a range substantially between fifteen to twenty-five volts. In another exemplary embodiment, the ESD protection circuit further includes a transient voltage suppressing (TVS) circuit connected to the triggering diode to turn on the TVS circuit for conducting a reverse current therethrough when a transient voltage greater than the breakdown voltage V is applied to the triggering diode. In another exemplary embodiment, the TVS circuit further includes a SCR circuit wherein the SCR circuit includes a first bipolar-junction transistor (BJT) coupled in parallel to a second BJT to function as a main clamp circuit of the TVS circuit. In another exemplary embodiment, the TVS circuit further includes a BJT transistor triggered by the triggering diode to function as a main clamp circuit of the TVS circuit. In another exemplary embodiment, the ESD protection circuit further includes a second triggering diode including a second junction between a second PG region and the N-well wherein the second PG region having a dopant profile substantially equivalent to the P-drain dopant profile of a PMOS transistor having a breakdown voltage represented by V whereby the triggering diode for conducting a current when a voltage greater than the breakdown voltage V is applied. In another exemplary embodiment, the dopant profile of the second PG region further comprising two dopant implant profiles including a shallow implant profile with a higher dopant concentration and a deep implant profile with a lower dopant concentration. In another exemplary embodiment, the dopant profile of the second PG region further comprising two dopant implant profiles including a shallow implant profile with a higher dopant concentration of approximately 5E19 ions/cm$^3$ to a depth less than 0.5 micrometers and a deep implant profile with a lower dopant concentration of approximately 1E18 ions/cm$^3$ to a depth of about than 1.0 micrometer to provide a breakdown voltage in a range substantially between fifteen to twenty-five volts. In an exemplary embodiment, the PG region is electrically connected to a ground electrode and the N-well is electrically connected to a Vcc electrode. In an exemplary embodiment, the PG region and the N-well are disposed near a top surface of a P-type semiconductor substrate.

The present invention further discloses an ESD protection circuit that includes a triggering diode including a junction between a NG region and the P-well wherein the NG region having a dopant profile substantially equivalent to a N-drain dopant profile of a NMOS transistor having a breakdown voltage represented by V whereby the triggering diode for conducting a current when a voltage greater than the breakdown voltage V is applied. In an exemplary embodiment, the dopant profile of the NG region further includes two dopant implant profiles including a shallow implant profile with a higher dopant concentration and a deep implant profile with a lower dopant concentration. In another exemplary embodiment, the dopant profile of the NG region further includes two dopant implant profiles including a shallow implant profile with a higher dopant concentration of approximately 5E19 ions/cm$^3$ to a depth less than 0.5 micrometers and a deep implant profile with a lower dopant concentration of approximately 1E18 ions/cm$^3$ to a depth of about than 1.0 micrometer to provide a breakdown voltage approximately in a range of twenty to thirty volts.

The present invention further discloses a method to manufacture an electrostatic discharge (ESD) protection circuit. The method includes a step of forming a N-well in a semiconductor substrate and then implanting a PG region in the N-well thus forming a junction between the PG region and the N-well constituting a triggering diode wherein the PG region having a dopant profile of a PMOS transistor having a breakdown voltage represented by V whereby the triggering diode for conducting a current when a voltage greater than the breakdown voltage V is applied to the triggering diode. In an exemplary embodiment, the step of implanting the PG region further includes a shallow dopant implant with a high implant dosage and a deep dopant implant with a low implant dosage to form a dopant profile of the PG region with two dopant implant profiles including a shallow implant profile with a higher dopant concentration and a deep implant profile with a lower dopant concentration. In another exemplary embodiment, the method further includes a step of forming a transient voltage suppressing (TVS) circuit in the semiconductor substrate connecting to the triggering diode to trigger the TVS circuit for conducting a reverse current therethrough when a transient voltage greater than the breakdown voltage V is applied to the triggering diode. In another exemplary embodiment, the step of implanting the PG region further includes a shallow dopant implant with a high implant dosage and a deep dopant implant with a low implant dosage to form a dopant profile of the PG region with two dopant implant profiles including a shallow implant profile with a higher dopant concentration of approximately 5E19 ions/cm$^3$ to a depth less than 0.5 micrometers and a deep implant profile with a lower dopant concentration of approximately 1E18 ions/cm$^3$ to a depth of about than 1.0 micrometer to provide a breakdown voltage in a range substantially between fifteen to twenty-five volts. In another exemplary embodiment, the step of forming the TVS circuit in the semiconductor substrate further includes a step of forming a SCR circuit with a first bipolar-junction transistor (BJT) coupled in parallel to a second BJT to function as a main clamp circuit of the TVS circuit. In another exemplary embodiment, the method further includes a step of implanting a second PG region in the N-well thus forming a second junction between the second PG region and the N-well constituting a second triggering diode wherein the second PG region having a dopant profile of a PMOS transistor having a breakdown voltage represented by V whereby the second triggering diode for conducting a current when a voltage greater than the breakdown voltage V is applied to the second triggering diode.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 1A to 1C are cross sectional views of the transient voltage suppressing (TVS) circuits disclosed in a prior patent applications by the Applicants of this invention.

FIG. 2 is a cross sectional view of an ESD protection circuit for high voltage (HV) application by applying the light doped drain (LDD) CMOS technologies and FIG. 2A shows a similar ESD protection circuit as FIG. 2 with reverse polarity configuration of this invention.

DETAILED DESCRIPTION OF THE METHOD

Figure 2A:
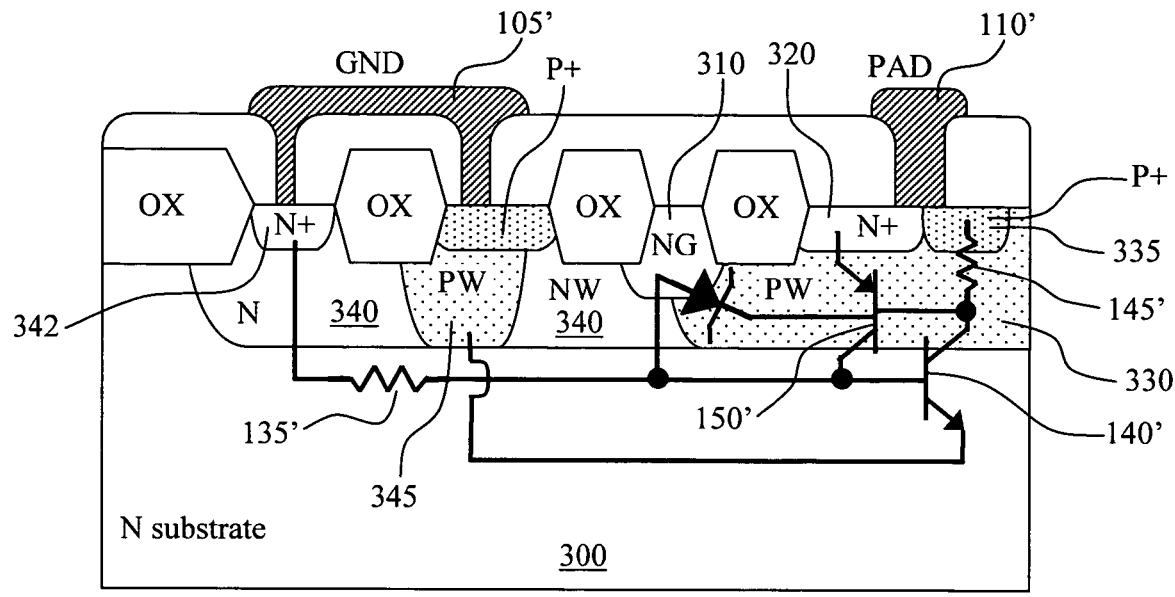

For better understanding of this invention, the descriptions of the FIGS. 1A and 1B below are provided as background reference information of the transient voltage suppressing (TVS) circuits disclosed previously by a common Inventor of this Application in application Ser. Nos. 11/444,555 and 11/712,317. The disclosures made in these two Applications are hereby incorporated by reference in this Application. The TVS circuits as disclosed can be manufactured with mainstream CMOS technologies thus able to reduce the manufacturing costs of these circuits and can be conveniently integrated with different application circuit to provide TVS and ESD protection as will be further described in different exemplary embodiments below.

FIG. 1A is a cross sectional view of a transient voltage suppressing (TVS) circuit supported on P-substrate 200. A P type region 210 is placed next to an N+ region 215 forming a Zener diode with cathode connecting to Vcc pad 110. A P+ region 220 also connects to Vcc pad 110. P+ region 220 disposed next to an N well region 230 above P substrate 200 forms PNP transistor, with P substrate 200 connecting to Gnd pad 105 through P well 240 and P region 242. The lateral path in P substrate 200 from N well 230 to P well 240 provides the resistance for resistor 135. The path from N region 235 to N well 230 provides resistance 145. The N-well 230 disposed above the P-substrate 200 in turn electrically contacting an N-region 245 thus constituting the NPN transistor 140. The P-type region 210 formed next to the N+ region 215 within P well 240 is to tailor the trigger breakdown voltage BV of the trigger diode 130, i.e., the diode formed between the P region 210 and the N+ region 215, to be less than or equal to the BVceo of the NPN transistor 140. The other way of tailoring the BV and BVceo is to increase the gradient of the N doping of N+ region 235 so that the collector to emitter breakdown voltage with the base left open (CEO) is tailored to the desired value. A combination of the two could also be used to get desired BV and BVceo. FIG. 1A shows a TVS circuit that uses the diode formed between P type region 210 and N+ region 215 as trigger. The P/N+ junction typically breakdown around 8 volts therefore the TVS as shown in FIG. 1A is rated as 5 V.

Referring to FIGS. 1B and 1C for the cross sectional views of the main clamp circuit of another TVS circuit. The TVS includes the improved trigger NMOS 191 integrated with NPN bipolar transistor 192 and the PNP bipolar transistor 194 thus forming the SCR. The new TVS as shown are manufactured with mainstream CMOS technology. FIG. 1B shows the main clamp circuit supported on a P substrate 200'. A pair of N+ regions 215' under a gate 250' constitutes the drain and source of trigger NMOS 191' while a P-well 241' under the gate 216' forms as the body of NMOS. A P+ region 220' disposed next to an N well region 230' above P substrate 200' forms PNP transistor 194', with P substrate 200' connecting to Gnd pad 105' through P well 240' and P region 242' and P+ region 220' connected to Vcc pad 110'. The lateral path in P substrate 200' from the N well 230' to the P well 240' provides the resistance for resistor 195'. The resistance of resistor 193' can be adjusted by the adjusting the width of P+ region 220' and dopant concentration of N-well 230'. The N-well 230' and N-well 232' disposed above the P-substrate 200' constitute the NPN transistor 192'. Optional P-type regions 210' formed next to the NMOS source and drain N+ regions 215' within P well 240' constitute protection diodes to lower down the breakdown of trigger NMOS transistor 191' from about 10 Volts to about 6 Volts, at the same time provide more substrate current to turn on NPN/SCR. The N+ and P+ diffusion regions 215' and 220' in FIG. 1C are masked by the active region. The NW 230' below the N+ regions 215' is connected to Vcc 110' that increases the base resistance of the PNP transistor and also helps to turn-on the SCR at high currents. The P+ region 220' of the SCR anode region is also staggered in the layout to control the SCR holding current. The NW 230' under the P+emitter 220' or anode forms the collector of the NPN transistor that forms part of the SCR. With a circuit and the device configurations shown above, the TVS circuits shown in FIGS. 1B and 1C achieve a transient voltage protection at approximately 3.3 volts. As shown in FIG. 1B, an optional P-type regions 210' formed next to the NMOS source and drain N+ regions 215' within P well 240' constitute protection diodes to lower down the breakdown of trigger NMOS transistor 191' from about 10 Volts to about 6 Volts, at the same time provide more substrate current to turn on the NPN/SCR.

Referring to FIG. 2 for a cross sectional view of an electrostatic discharge (ESD) protection circuit of this invention supported on P-substrate 300. In contrast to the TVS circuit shown in FIG. 1A, a triggering diode is formed by the junction between PG region 310 and the N-well 330. This triggering diode now replaces the triggering diode formed by the junction between P type region 210 and N+ region 215 in FIG. 1A. The dopant profile of the PG region 310 is shown in FIG. 3 that includes two dopant implant profiles. A P+shallow implant with dopant concentration of about 5E19 atoms/cm$^3$ extends to less than 0.5 um and a deeper P implant with dopant concentration of about 1E18 extends to about 1 um. The N well 330 has a concentration of 2-5E11 with a depth between 1.5 and 2.5 um. The P substrate has a concentration of 1-2E15. The dopant profile of the PG region 310 is the same as the P drain dopant profile of an 18V PMOS therefore the junction between PG region and NW will not breakdown below a voltage of 18 volts. When a transient voltage higher that 18 volts is applied, the diode will break down and current will flow from the Vcc PAD 110' through diode to P-well (PW) 330 and to substrate 300 and to the GND. A P+ region 320 also connects to Vcc pad 110'. The P+ region 320 disposed next to an N well region 330 above P substrate 200 forms PNP transistor, with P substrate 300 connecting to Gnd pad 105' through P well 340 and the P region 342. The lateral path in P substrate 300 from N well 330 to P well 340 provides the resistance for resistor 135'. The path from N region 335 to N well 330 provides resistance 145'. The N-well 330 disposed above the P-substrate 300 in turn electrically contacting an N-region 345 thus constituting the NPN transistor 140' and the P+ region 320 above the N-well 330 and electrically contacting the P-substrate 300 constituting PNP transistor 150' to function with the transistor 140' as the SCR circuit.

Figure 3:
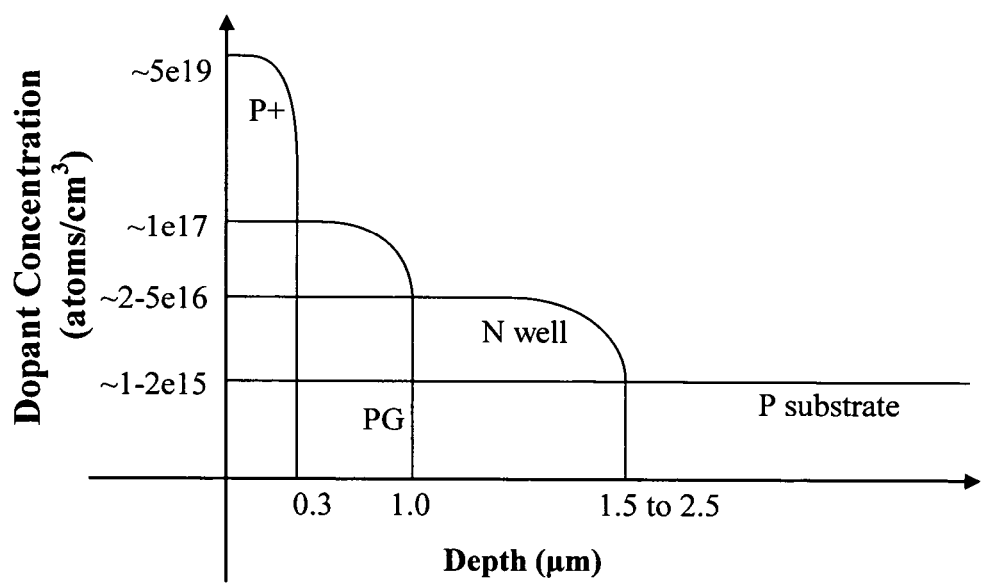
FIG. 3 is a diagram for showing the dopant profiles of the ESD protection circuit in different regions shown in FIG. 2.
Figure 3A:
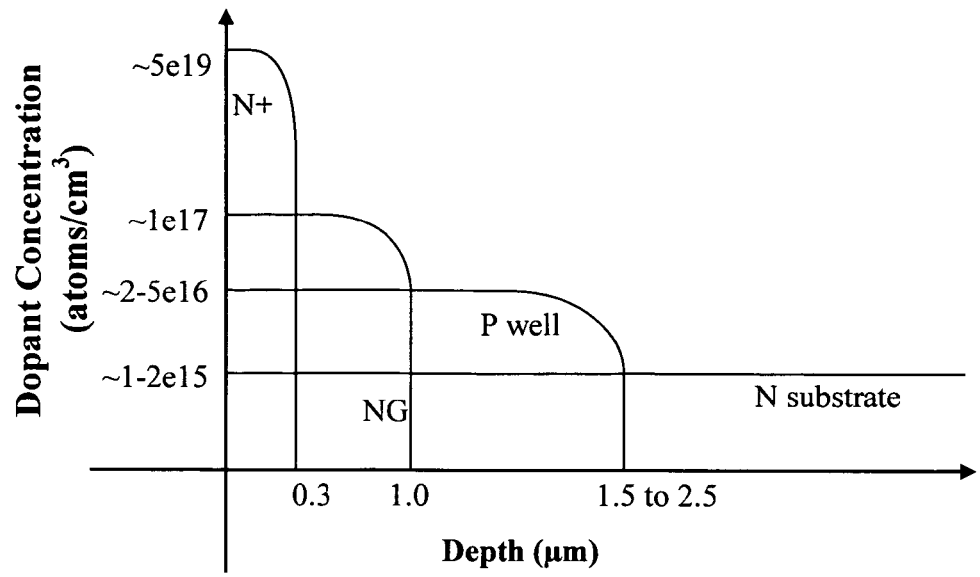
FIG. 3A is a diagram for showing the dopant profiles of the ESD protection circuit in different regions shown in FIG. 2A.

Therefore, FIG. 2 shows an ESD protection circuit that uses the diode formed between PG region 310 and N+ region 315 as trigger diode. With special P+ dopant profile for the PG region 310, the P/N+ junction between the PG region 310 and the N-well 330 will not breakdown below 18. A high voltage ESD protection circuit is therefore provided. FIG. 2A shows a similar ESD protection circuit as FIG. 2 with reverse polarity arrangement as an alternate embodiment of this invention. FIG. 3 is a diagram for showing the dopant profiles of the ESD protection circuit in different regions shown in FIG. 2. FIG. 3A is a diagram for showing the dopant profiles of the ESD protection circuit in different regions shown in FIG. 2A.

Figure 4:
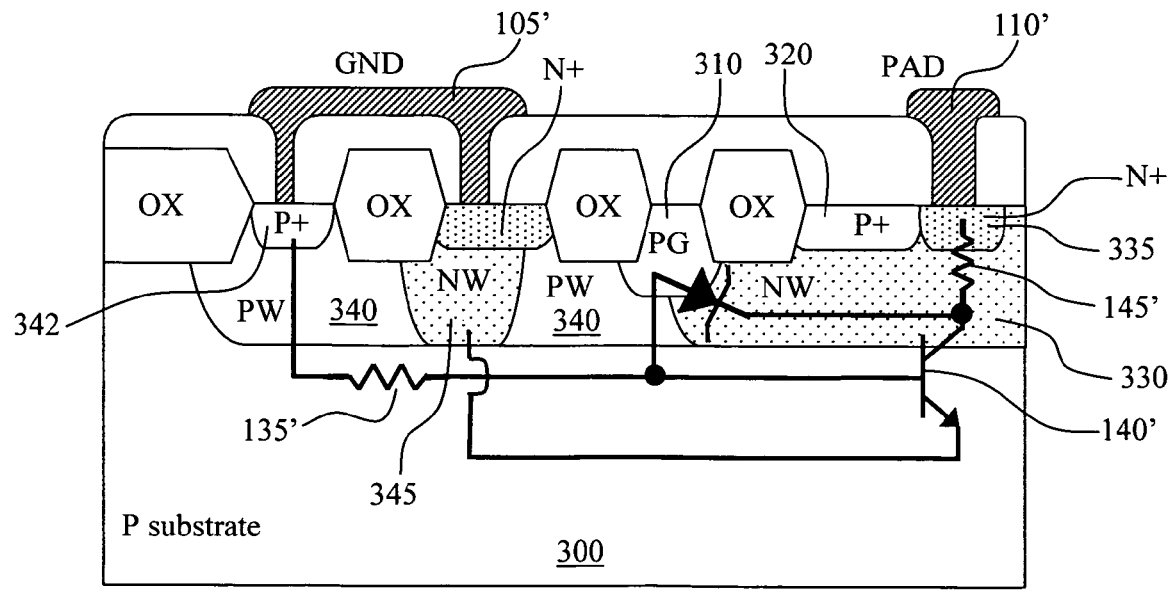
FIGS. 4 to 5 are cross sectional views of ESD protection circuit implemented with different TVS circuits as alternate embodiments of the ESD-TVS circuit shown in FIG. 2.

FIG. 4 is a second embodiment of the ESD protection circuit by using the diode formed between the PG region 310 and the N-well 330 with special dopant profiles to trigger the NPN transistor 140' instead of the SCR formed by the NPN transistor 140' and the PNP transistor 150' of FIG. 2, to reduce snapback. As the pad 110' for connection to P+ region 320 of FIG. 2 is eliminated by eliminating the P+ region 320, the device is configured as diode triggered NPN and the snapback is reduced compared to diode triggered SCR.

Figure 5:
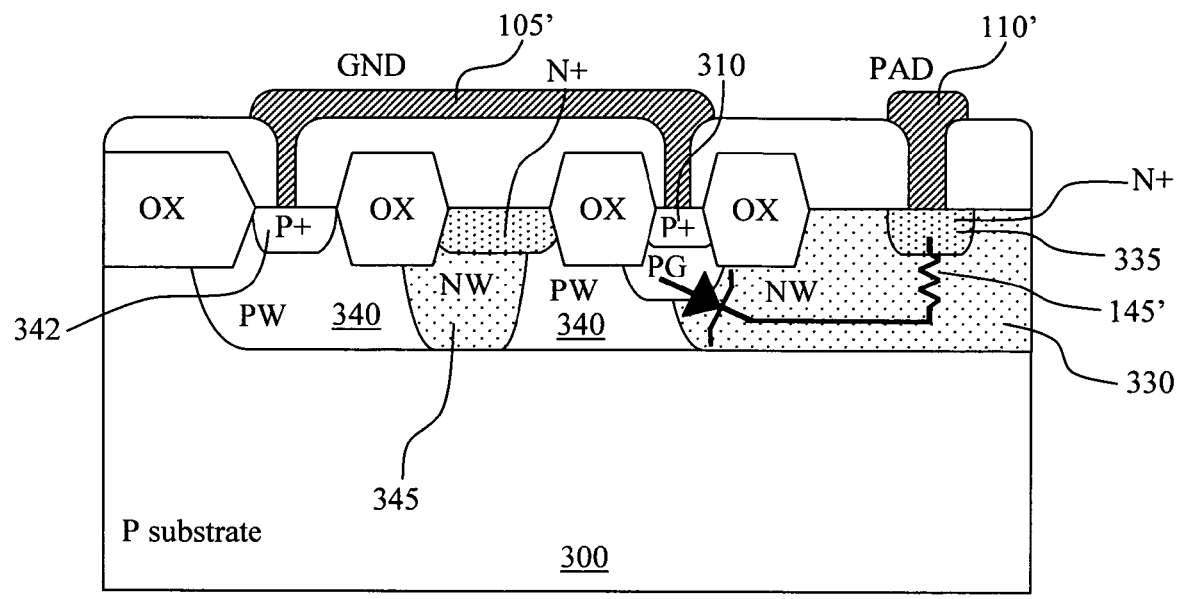

FIG. 5 is a third embodiment of the protection circuit where the N+ region connection to GND is eliminated so the NPN transistor 140' is eliminated. The protection device is essentially a diode.

Figure 6:
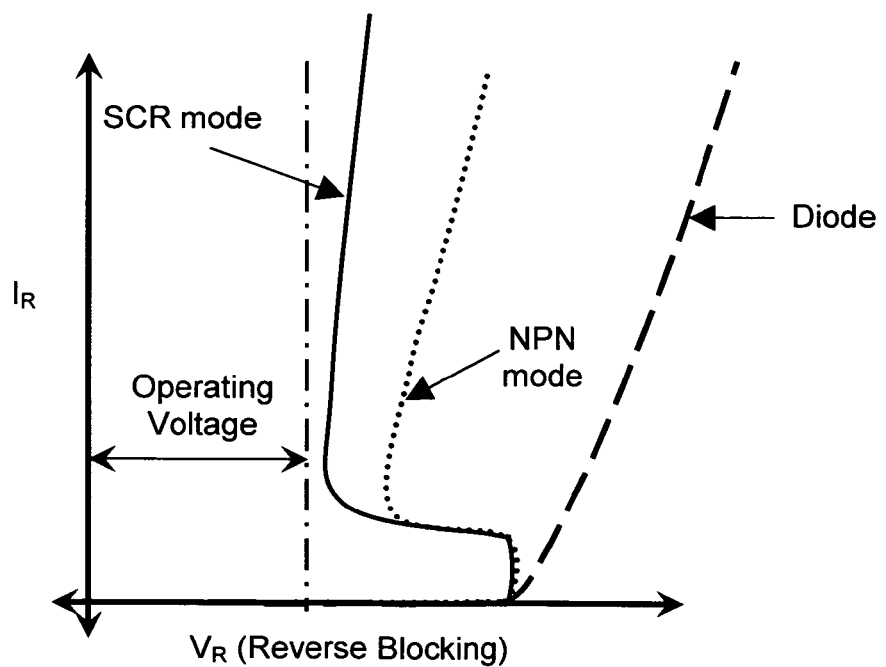
FIG. 6 is an I-V diagram for showing the voltage variation of the ESD-TVS shown in FIGS. 2 and 4 and the ESD circuit shown in FIG. 5.

FIG. 6 is a plot of I-V curves of different embodiments. The circuit with the SCR of FIG. 2 has the least resistance with increase of current but with largest snapback. Such large snapback may not be an issue for I/O protection but is not desirable for TVS connecting to Vcc where such large snapback may cause the destruction of other devices due to the large power supplied by Vcc. The diode trigger NPN improves the snapback but with the increase of resistance. The diode mode has no snapback but with the greatest resistance.

Figure 7:
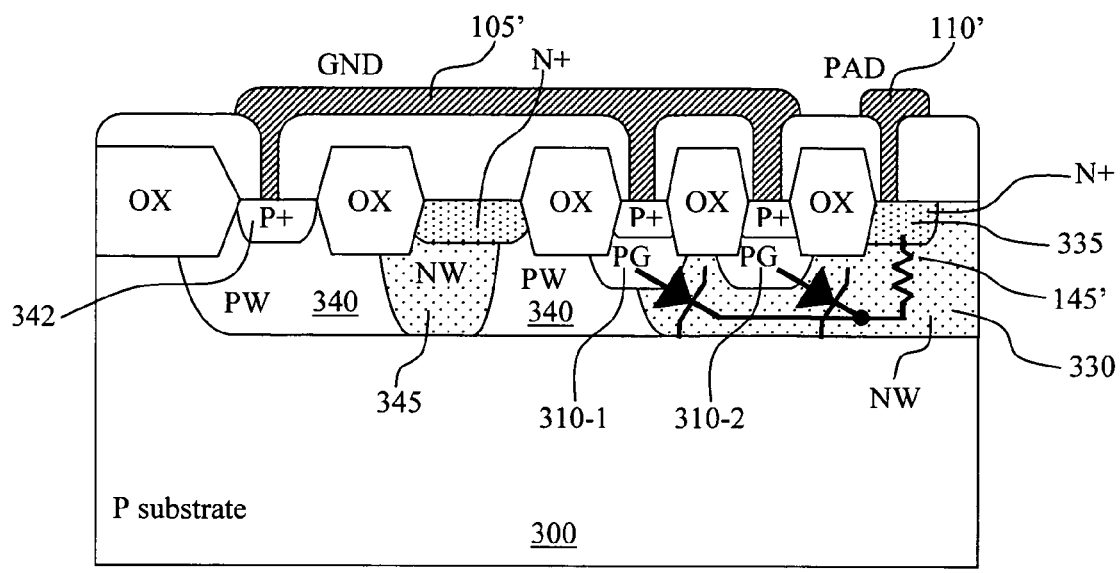
FIG. 7 is cross sectional view of an alternate embodiment of the ESD protection circuit of FIG. 5 with two triggering diodes to increase the contact areas and reduce the resistance of the ESD protection circuit.

FIG. 7 is an alternate embodiment of the protection circuit shown in FIG. 5. The protection circuit is similar to that of FIG. 5 except that there is an additional diode formed between a first PG region 310-1 and the N-well 330 and also between the PG region 310-2 and the N-well 330. With the additional diodes, there is an improvement over the protection circuit of FIG. 5 by increasing the diode contact surface area for increasing the current handling capability and to reduce the resistance.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. An electrostatic discharge (ESD) protection circuit comprising:
   a triggering diode including a P-grade (PG) region and disposed atop of a junction between a P-well a N-well wherein said PG region comprising at least two different dopant concentrations forming a junction with the N-well having a breakdown voltage represented by V whereby said triggering diode conducting a current when a voltage greater than said breakdown voltage V is applied; and wherein the N-well encompasses a N+ region electrically connected to a Vcc electrode pad; and the PG region is electrically connected to a ground voltage wherein the ESD protection circuit constituting a diode for performing an ESD protection function.

2. The ESD protection circuit of claim 1 wherein:
said at least two different dopant concentrations of said PG region further comprising two dopant implant profiles including a shallow implant profile with a higher dopant concentration of approximately 5E19 ions/cm$^3$ to a depth less than 0.5 micrometers and a deep implant profile with a lower dopant concentration of approximately 1E18 ions/cm$^3$ to a depth of about than 1.0 micrometer to provide a breakdown voltage in a range substantially between fifteen to twenty-five volts.

3. The ESD protection circuit of claim 2 wherein:
a P+ contact dopant region disposed above the second N-well for electrically connecting to the ground voltage; and
a first oxide insulation block disposed next to the N+ contact dopant region to insulate the N+ contact dopant region from the PG region and a second oxide insulation block for insulation the PG region from the N+ region encompassed in the N-well electrically connected to the Vcc electrode pad.

4. The ESD protection circuit of claim 1 wherein:
the N-well is coupled with the P substrate and a second N-well disposed above the P-substrate at a distance away from the N-well to function as a coupled NPN transistor and wherein the N+ region is electrically connected to the Vcc electrode pad and a ground voltage connection is moved away from the PG region and is connected to the second N-well wherein the PNP transistor is triggered by the triggering diode to function as the ESD protection circuit.

5. The ESD protection circuit of claim 4 wherein:
the N-well is coupled to a P+ region encompassed in the N-well and a P substrate to function as a coupled PNP transistor and wherein the N-well is further coupled with the P substrate and a second N-well disposed above the P-substrate at a distance away from the N-well to function as a coupled NPN transistor thus combining the PNP transistor and the NPN transistor into a silicon controlled rectifier (SCR); and wherein the N+ region and P+ region encompassed in the P-well are electrically connected to the Vcc electrode pad and the a ground voltage connection is moved from the PG region to connect to the second N-well wherein the SCR is triggered by the triggering diode to function as the ESD protection circuit.

6. The ESD protection circuit of claim 4 wherein:
a P+ contact dopant region disposed above the second N-well for electrically connecting to the ground voltage; and
a first oxide insulation block disposed next to the N+ contact dopant region to insulate the N+ contact dopant region from the PG region and a second oxide insulation block for insulation the PG region from the P+ region and the N+ region encompassed in the N-well electrically connected to the Vcc electrode pad.

7. The ESD protection circuit of claim 1 further comprising:
a P+ contact dopant region disposed above the PG region for electrically connecting to the ground voltage; and
an oxide insulation block disposed next to the P+ contact dopant region to insulate the P+ contact dopant region from the N+ region electrically connected to the Vcc electrode pad.

8. The ESD protection circuit of claim 7 further comprising:
a second triggering diode including a second junction between a second PG region and said N-well comprising at least two different dopant concentrations wherein said second PG region is encompassed in the N-well and having a dopant profile substantially equivalent to said P-drain dopant profile of a PMOS transistor having a breakdown voltage represented by V whereby said triggering diode for conducting a current when a voltage greater than said breakdown voltage V is applied;
said dopant profile of said second PG region further comprising two dopant implant profiles including a shallow implant profile with a higher dopant concentration and a deep implant profile with a lower dopant concentration; and
a second P+ contact dopant region disposed above the second PG region for electrically connecting to the ground voltage and a second oxide insulation block disposed next to the second P+ contact dopant region to insulate the second P+ contact dopant region from the N+ region electrically connected to the Vcc electrode pad.

9. The ESD protection circuit of claim 8 wherein:
said at least two different dopant concentrations of said second PG region further comprising two dopant implant profiles including a shallow implant profile with a higher dopant concentration of approximately 5E19 ions/cm$^3$ to a depth less than 0.5 micrometers and a deep implant profile with a lower dopant concentration of approximately 1E18 ions/cm$^3$ to a depth of about than 1.0 micrometer to provide a breakdown voltage in a range substantially between fifteen to twenty-five volts.

10. An ESD protection circuit comprising:
a triggering diode including a N-grade (NG) region disposed atop of a junction between a N-well and a P-well wherein said NG region comprising at least two different dopant concentrations forming a junction with the P-well having a breakdown voltage represented by V whereby said triggering diode conducting a current when a voltage greater than said breakdown voltage V is applied; and wherein the P-well encompasses a P+ region electrically connected to a Vcc electrode pad; and the NG region is electrically connected to a ground voltage wherein the ESD protection circuit constituting a diode for discharging an electrical current.

11. The ESD protection circuit of claim 10 wherein:
said at least two different dopant concentrations of said PG region further comprising two dopant implant profiles including a shallow implant profile with a higher dopant concentration of approximately 5E19 ions/cm$^3$ to a depth less than 0.5 micrometers and a deep implant profile with a lower dopant concentration of approximately 1E18 ions/cm$^3$ to a depth of about than 1.0 micrometer to provide a breakdown voltage approximately in a range of twenty to thirty volts.

12. A method for configuring an electrostatic discharge (ESD) protection circuit comprising:
forming a N-well in a semiconductor substrate and then implanting a P-grade (PG) region in said N-well comprising at least two different dopant concentrations thus forming a junction between said PG region and said N-well constituting a triggering diode wherein said PG region having a dopant profile of a p-channel metal oxide semiconductor (PMOS) transistor having a breakdown voltage represented by V whereby said triggering diode for conducting a current when a voltage greater than said breakdown voltage V is applied to said triggering diode;

connecting a N+ region encompassed in the N-well to a Vcc electrode pad; and connecting the PG region to a ground voltage for forming the ESD protection circuit as a diode for discharging an electrical current.

13. The method of claim 12 further comprising:

forming a P+ contact dopant region above the PG region for electrically connecting to the ground voltage; and forming an oxide insulation block next to the P+ contact dopant region to insulate the P+ contact dopant region from the N+ region electrically connected to the Vcc electrode pad.

14. The method of claim 12 wherein:

said step of implanting said PG region comprising at least two different dopant concentrations further comprising a shallow dopant implant with a high implant dosage and a deep dopant implant with a low implant dosage to form a dopant profile of said PG region with two dopant implant profiles including a shallow implant profile with a higher dopant concentration of approximately 5E19 ions/cm$^3$ to a depth less than 0.5 micrometers and a deep implant profile with a lower dopant concentration of approximately 1E18 ions/cm$^3$ to a depth of about than 1.0 micrometer to provide a breakdown voltage in a range substantially between fifteen to twenty-five volts.

15. The method of claim 14 wherein:

the step of forming the N-well is a step of forming the N-well coupled with the P substrate and a second N-well disposed above the P-substrate at a distance away from the N-well to function as a coupled NPN transistor; and electrically connecting the N+ region to the Vcc electrode pad and moving a ground voltage connection away from the PG region for connecting to the second N-well for applying the triggering diode to trigger the PNP transistor for performing an ESD protection.

16. The method of claim 12 further comprising:

implanting a second PG region in said N-well thus forming a second junction between said second PG region comprising at least two different dopant concentrations encompassed in said N-well constituting a second triggering diode wherein said second PG region having a dopant profile of a PMOS transistor having a breakdown voltage represented by V whereby said second triggering diode for conducting a current when a voltage greater than said breakdown voltage V is applied to said second triggering diode; and forming a second P+ contact dopant region above the second PG region for electrically connecting to the ground voltage and a forming an oxide insulation block disposed next to the second P+ contact dopant region to insulate the second P+ contact dopant region from the N+ region electrically connected to the Vcc electrode pad.

* * * * *